United States Patent
Tanimoto et al.

(10) Patent No.: US 9,698,082 B2
(45) Date of Patent: Jul. 4, 2017

(54) AU-BASED SOLDER DIE ATTACHMENT SEMICONDUCTOR DEVICE AND METHOD FOR MANUFACTURING THE SAME

(71) Applicants: NISSAN MOTOR CO., LTD., Yokohama-shi, Kanagawa (JP); SANKEN ELECTRIC CO., LTD., Niiza-shi, Saitama (JP); FUJI ELECTRIC CO., LTD., Kawasaki-shi, Kanagawa (JP)

(72) Inventors: Satoshi Tanimoto, Yokohama (JP); Shinji Sato, Niiza (JP); Hidekazu Tanisawa, Niiza (JP); Kohei Matsui, Hino (JP)

(73) Assignees: NISSAN MOTOR CO., LTD., Yokohama-shi (JP); SANKEN ELECTRIC CO., LTD., Niiza-shi (JP); FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/442,570

(22) PCT Filed: Nov. 13, 2013

(86) PCT No.: PCT/JP2013/080695
§ 371 (c)(1),
(2) Date: May 13, 2015

(87) PCT Pub. No.: WO2014/077282
PCT Pub. Date: May 22, 2014

(65) Prior Publication Data
US 2016/0293522 A1    Oct. 6, 2016

(30) Foreign Application Priority Data

Nov. 15, 2012 (JP) .................................. 2012-250852

(51) Int. Cl.
*H01L 23/48* (2006.01)
*H01L 23/495* (2006.01)
(Continued)

(52) U.S. Cl.
CPC .... *H01L 23/49513* (2013.01); *H01L 21/4853* (2013.01); *H01L 23/3735* (2013.01);
(Continued)

(58) Field of Classification Search
CPC ........... H01L 23/49513; H01L 23/3735; H01L 23/488; H01L 23/49548; H01L 23/49562; H01L 24/29; H01L 24/32; H01L 24/83
(Continued)

(56) References Cited

U.S. PATENT DOCUMENTS 4,950,843 A    8/1990  Hirota
6,903,458 B1*  6/2005  Nathan .............. H01L 23/49833
                                                           257/737
(Continued)

FOREIGN PATENT DOCUMENTS

JP    2002-299495 A    10/2002

OTHER PUBLICATIONS

P. Alexandrov, W. Wright, M. Pan, M. Weiner, L. Jiao, J. H. Zhao, "Demonstration of high voltage (600-1300 V), high current (10-140 A), last recovery 4H-SiC p-i-n/Schottky (MPS) barrier diodes", Solid-State Electron., 47 (2003), p. 263-269.
(Continued)

*Primary Examiner* — Nitin Parekh
(74) *Attorney, Agent, or Firm* — Foley & Lardner LLP (57) ABSTRACT

A semiconductor device according to the present invention, having an Au-based solder layer (3) sandwiched between a semiconductor element (1) and a Cu substrate (2) made mainly of Cu, in which the semiconductor device includes: a dense metal film (23) which is arranged between the Cu
(Continued)

substrate (2) and the Au-based solder layer (3), and has fine slits (24) patterned to have a predetermined shape in a plan view; and fine structures (4) with dumbbell-like cross section, which have Cu and Au as main elements, and are each buried in the Cu substrate (2), the Au-based solder layer (3), and the fine slits (24) of the dense metal film (23).

10 Claims, 4 Drawing Sheets (51) Int. Cl.
    *H01L 23/488*     (2006.01)
    *H01L 23/492*     (2006.01)
    *H01L 23/373*     (2006.01)
    *H01L 21/48*     (2006.01)
    *H01L 23/482*     (2006.01)
    *H01L 23/00*     (2006.01)

(52) U.S. Cl.
CPC .......... *H01L 23/488* (2013.01); *H01L 23/492* (2013.01); *H01L 23/49548* (2013.01); *H01L 23/49562* (2013.01); *H01L 23/49582* (2013.01); *H01L 24/29* (2013.01); *H01L 24/32* (2013.01); *H01L 24/83* (2013.01); *H01L 23/4827* (2013.01); *H01L 24/03* (2013.01); *H01L 24/05* (2013.01); *H01L 24/75* (2013.01); *H01L 2224/0345* (2013.01); *H01L 2224/04026* (2013.01); *H01L 2224/05082* (2013.01); *H01L 2224/05155* (2013.01); *H01L 2224/05166* (2013.01); *H01L 2224/05639* (2013.01); *H01L 2224/2732* (2013.01); *H01L 2224/291* (2013.01); *H01L 2224/29144* (2013.01); *H01L 2224/3207* (2013.01); *H01L 2224/32059* (2013.01); *H01L 2224/32225* (2013.01); *H01L 2224/32245* (2013.01); *H01L 2224/32505* (2013.01); *H01L 2224/7501* (2013.01); *H01L 2224/75102* (2013.01); *H01L 2224/75251* (2013.01); *H01L 2224/75756* (2013.01); *H01L 2224/8309* (2013.01); *H01L 2224/83011* (2013.01); *H01L 2224/8321* (2013.01); *H01L 2224/83022* (2013.01); *H01L 2224/83048* (2013.01); *H01L 2224/83075* (2013.01); *H01L 2224/83101* (2013.01); *H01L 2224/83385* (2013.01); *H01L 2224/83439* (2013.01); *H01L 2224/83444* (2013.01); *H01L 2224/83447* (2013.01); *H01L 2224/83455* (2013.01); *H01L 2224/83457* (2013.01); *H01L 2224/83815* (2013.01); *H01L 2924/01322* (2013.01); *H01L 2924/12042* (2013.01); *H01L 2924/15747* (2013.01); *H01L 2924/15787* (2013.01); *H01L 2924/35121* (2013.01); *H01L 2924/3651* (2013.01)

(58) Field of Classification Search
USPC .................................................. 257/737, 772
See application file for complete search history.

(56) References Cited

U.S. PATENT DOCUMENTS

| | | | | |
|---|---|---|---|---|
| 7,446,028 B2 * | 11/2008 | Hiatt | ................... | H01L 23/3114 257/779 |
| 8,866,300 B1 * | 10/2014 | Sherrer | ............... | B81C 1/00357 174/73.1 |
| 2002/0129894 A1 * | 9/2002 | Liu | ........................... | B32B 7/12 156/291 |
| 2003/0019568 A1 * | 1/2003 | Liu | ........................... | B32B 7/12 156/245 |
| 2012/0181679 A1 * | 7/2012 | Kadoguchi | ......... | H01L 23/3142 257/676 |
| 2012/0248977 A1 * | 10/2012 | Ootorii | ................ | H01L 25/167 313/524 |
| 2015/0115414 A1 * | 4/2015 | Umehara | ................ | H01L 29/04 257/627 |

OTHER PUBLICATIONS

R. W. Johnson and J. Williams, "SIC Power Device Packaging Technologies for 300 to 350° C. Applications", Mater. Sci. Forum 483-485 (2005) p. 785-790.

S. Tanimoto, K. Matsui, Y. Murakami, H. Yamaguchi, and H. Okumura, "Assessment of Au-Ge Die Attachment for an Extended Junction Temperature Range in Power Applications", Proceedings of IMAPS HiTEC 2010 (May 11-13, 2010, Albuquerque, New Mexico, USA), pp. 32-39.

* cited by examiner

|  | JOINT STRENGTH (MPa) | |
| --- | --- | --- |
|  | BEFORE TEST | AFTER TEST |
| PRESENT INVENTION | 105 | 100 |
| CONVENTIONAL TECHNOLOGY | 135 | 15 |

FIG. 5

AU-BASED SOLDER DIE ATTACHMENT SEMICONDUCTOR DEVICE AND METHOD FOR MANUFACTURING THE SAME

TECHNICAL FIELD

The present invention relates to a semiconductor device having a copper (Cu) substrate and a semiconductor element joined with a gold (Au)-based solder, and a method for manufacturing the same.

BACKGROUND ART

There has been developed a power semiconductor device using a wide band gap semiconductor made of silicon carbide (SiC), gallium nitride (GaN), diamond (C) or the like. Such a power semiconductor device, although operated at a high semiconductor joint temperature (Tj), has an on-resistance lower than that of a conventional power semiconductor device using silicon (Si) or gallium arsenic (GaAs), and thus is capable of fast switching. Therefore, reduction in chip size of the semiconductor device as well as reduction in size of a passive component and a cooler included in a system can be achieved. Thus, it is expected that a small, light and inexpensive power electronics system can be realized.

As a matter of course, high heat resistance is demanded for a joint portion, i.e., die attachment between a semiconductor element chip and a metal substrate, which are included in such a power semiconductor device operated at such a high semiconductor joint temperature (Tj). From the viewpoint of electric conductivity, thermal conductivity and price, a plate material mainly made of copper (Cu) is generally used as the metal substrate. Such a plate material is mostly used in a state of being attached to a ceramic insulating substrate. Hereinafter, substrates including the one having the plate material attached to the ceramic insulating substrate are simply referred to as a "Cu substrate".

Meanwhile, high melting point Au-based solder is widely used as a joint material (see Non Patent Literatures 1 to 3). The Au-based solder described here includes eutectic AuGe solder (melting point of 356° C.), eutectic AuSi solder (melting point of 363° C.), eutectic AuSn solder (melting point of 280° C.), and the like.

CITATION LIST

Non Patent Literature

Non Patent Literature 1: P. Alexandrov, W. Wright, M. Pan, M. Weiner, L. Jiao, J. H. Zhao, Solid-State Electron., 47 (2003) p. 263.
Non Patent Literature 2: R. W. Johnson and L. Williams, Mater. Sci. Forum 483-485 (2005) p. 785
Non Patent Literature 3: S. Tanimoto, K. Matsui, Y. Murakami, H. Yamaguchi, and H. Okumura, Proceedings of IMAPS HiTEC 2010 (May 11-13, 2010, Albuquerque, N. Mex., USA), pp. 32-39.

SUMMARY OF INVENTION

The Au-based solder die attachment of the conventional semiconductor device has a configuration in which the Au-based solder layer joined with a semiconductor element (SiC) chip is separated from the Cu substrate by applying a dense plating of Ni or the like, that functions as a barrier metal, to the Cu substrate. However, when such a semiconductor device is used over a long period of time at high temperature, joint strength of a solder joint layer is lowered with time. This leads to a problem that the semiconductor chip eventually comes off around the plating layer. This deterioration phenomenon occurs more significantly and in a shorter period of time at higher temperature.

In Non Patent Literature 3 described above, for example, when a die attachment having an SiC chip joined with AuGe solder on an Ni plating Cu plate is left in an atmosphere of 300° C., the joint strength is reported to be lowered to near the lower limit specified in IEC60749-19 standard after about 3000 hours.

The present invention has been made to solve such conventional problems. It is an object of the present invention to provide an Au-based solder die attachment semiconductor device capable of extending a peel-off mode life by delaying deterioration of joint strength due to heating of the semiconductor device, and to provide a method for manufacturing the same.

In order to achieve the above object, the invention of the present application includes a dense metal film provided between a Cu substrate and an Au-based solder layer, the dense metal film having fine slits pattern to have a predetermined shape in a plan view. Also, fine structures with dumbbell-like cross section, which have Cu and Au as main elements, are each buried in the Cu substrate, the Au-based solder layer, and the fine slits in the dense metal film.

DESCRIPTION OF EMBODIMENTS

Figure 1:
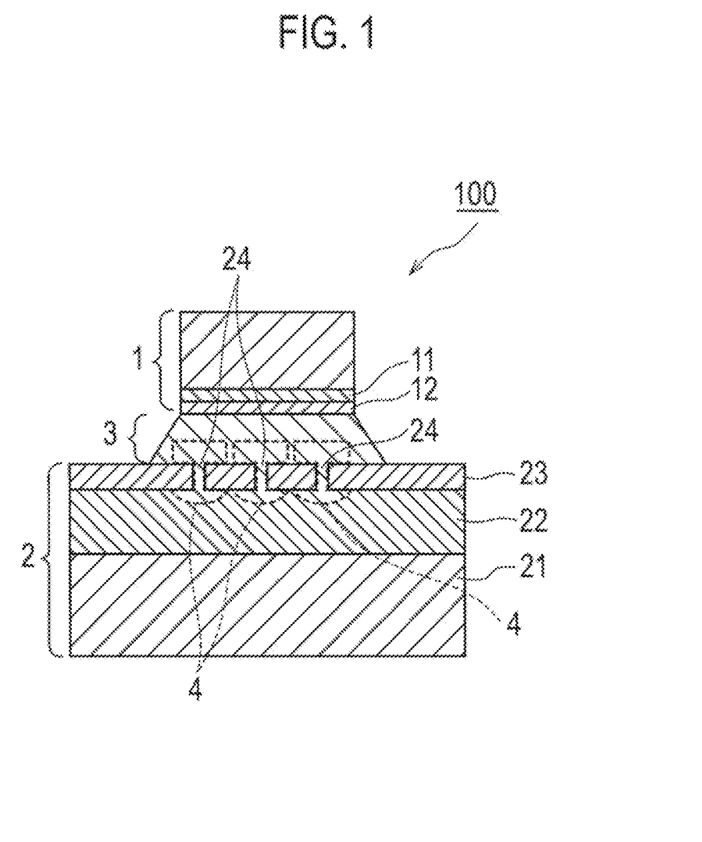
FIG. 1 is a cross-sectional view showing a main part of a semiconductor device according to an embodiment of the present invention.

With reference to the drawings, an embodiment of the present invention is described below. FIG. 1 is a cross-sectional view showing a configuration of a semiconductor device according to one embodiment of the present invention. Note that, in cross-sectional views used to explain the structure of this embodiment, dimensions in a thickness direction (vertical direction in the drawings) are exaggeratingly described to facilitate the understanding thereof.

Moreover, the following description is given of a case, as an example, where an SiC power element is used as a semiconductor element 1, eutectic AuGe solder is used as an Au-based solder layer 3, and an SiN ceramic substrate having metal Cu plates, mainly made of Cu, attached on both surfaces thereof is used as a Cu substrate 2.

However, this is just an example, and another wide band gap semiconductor element, such as a GaN element, a diamond element and a ZnO element, or an Si semiconductor element (SOI element or sensor element) for high-temperature application can be equally applied as the semiconductor element 1.

Also, Au-based solder used as the Au-based solder layer 3 is mainly made of Au, and typical examples thereof include eutectic AuGe solder, eutectic AuSi solder, eutectic AuSn solder, and the like. Moreover, a mixture of the solders described above or one obtained by adding another element to the eutectic solders may also be used. Furthermore, the solder does not necessarily have to have an eutectic composition but may have a hypereutectic or hypoeutectic composition having a liquidus temperature of approximately 420° C. or less.

Meanwhile, the Cu substrate 2 is not limited to the Cu substrate attached to the SiN ceramic substrate, but the Cu substrate attached to other types of ceramic substrate (such as alumina, aluminum nitride and beryllia) or a simple metal plate mainly made of Cu, such as a lead frame, may be used as the Cu substrate 2.

As shown in FIG. 1, a semiconductor device 100 according to this embodiment has a die attach structure in which the Cu substrate 2 and the semiconductor element 1 (semiconductor element chip) are joined with the Au-based solder layer 3. In other words, the semiconductor device 100 according to this embodiment is an Au-based solder die attachment semiconductor device having a die attachment structure in which the Au-based solder layer 3 is sandwiched between the semiconductor element chip (semiconductor element 1) and the Cu substrate 2 mainly made of Cu.

The semiconductor element 1 is a silicon carbide (SiC) power semiconductor element, and an ohmic contact 11 is formed on a back surface (lower surface in FIG. 1) thereof. The surface of (below in FIG. 1) the ohmic contact 11 is covered with a mounting electrode 12 for the purpose of improvement in solder wettability, prevention of solder intrusion, improvement in adhesion, and the like. As the mounting electrode 12, a Ti/Ni/Ag laminated deposited film (layer structure having Ti in contact with the ohmic contact 11 and Ag on the top), can be used, for example.

The Cu substrate 2 has a structure in which a metal Cu plate 22 mainly made of Cu is attached to at least one surface of the SiN ceramic substrate 21 by brazing or the like. On the surface of the metal Cu plate 22, a dense metal film 23 having fine slits 24 is provided. The dense metal film 23 is a metal film made of a nickel (Ni) film, a cobalt (Co) film, an NiCo mixed film (both of Ni and Co), an Ni/Co laminated film, or the like. The dense metal film 23 functions to ensure wettability of soldering and to prevent the Au-based solder layer 3 and the metal Cu plate 22 from coming into full contact with each other. Moreover, the dense metal film 23 has a thickness of less than 10 μm, and the easiest and cheapest way to form the dense metal film 23 is electroless plating. However, the dense metal film 23 may be formed by another film formation method such as sputtering and electron beam method. In this event, an Ni film or a Co film formed by electroless plating becomes an Ni—P film or a Co—P film having high concentrations of P (phosphorus).

Figure 5:
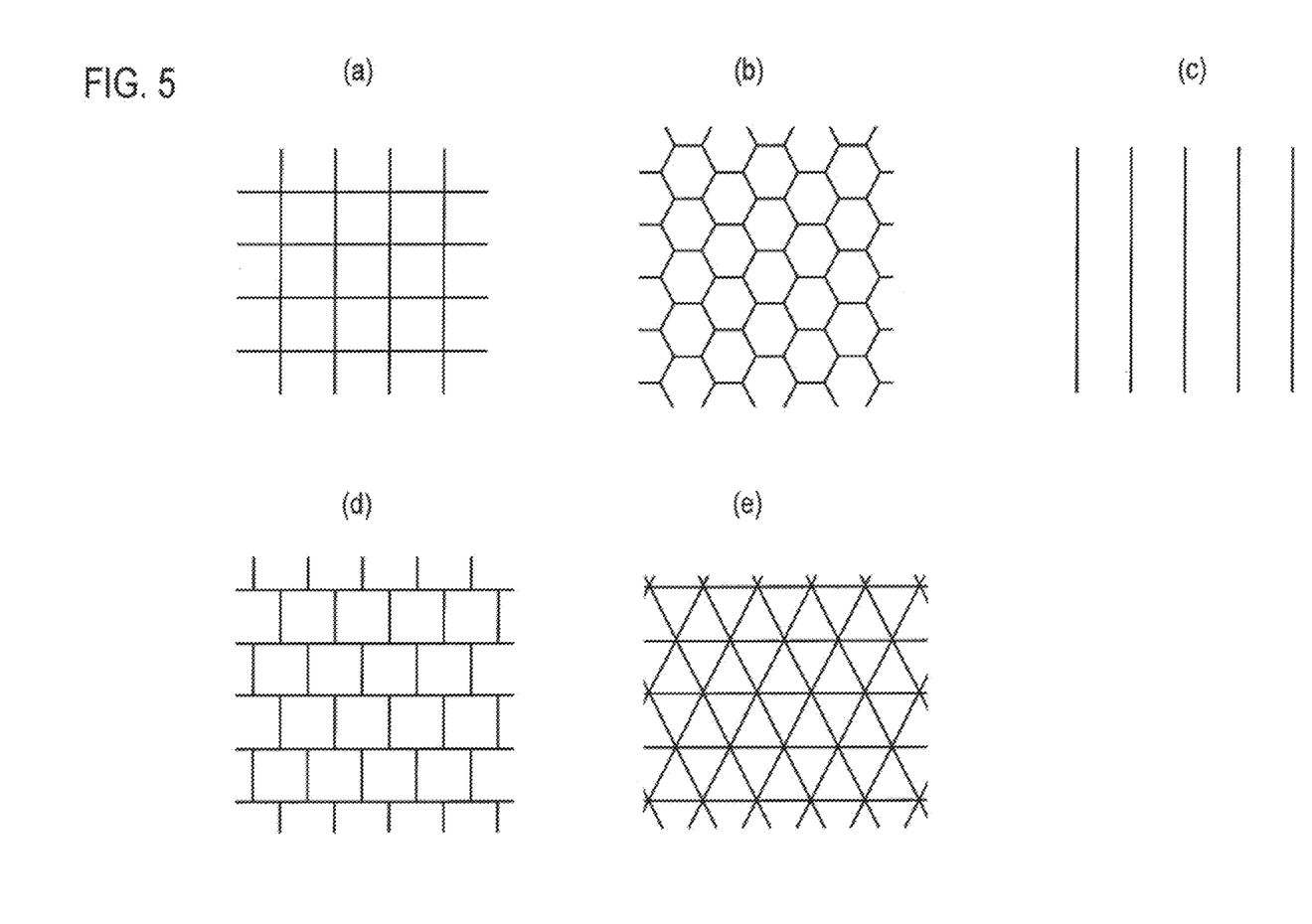
FIG. 5 is an explanatory diagram showing examples of a fine silt shape of a dense metal film used in the semiconductor device according to the present invention.

The fine slits 24 in the dense metal film 23 are extended linearly at a predetermined angle in a direction perpendicular to the page space, and patterned to have a predetermined shape in a plan view (when the semiconductor device 100 shown in FIG. 1 is viewed from above). FIG. 5 is an explanatory diagram showing examples of the shape of the fine slits 24 when the dense metal film 23 is planarly viewed. FIG. 5(*a*) shows an example of a rectangular periodic pattern in which slits are formed into a rectangular shape. FIG. 5(*b*) shows an example of a hexagonal periodic pattern in which slits are formed into a hexagonal shape. FIG. 5(*c*) shows an example of an equally spaced parallel line pattern in which slits are formed on parallel lines. FIG. 5(*d*) shows an example of a houndstooth rectangular periodic pattern in which slits are formed into a houndstooth shape. FIG. 5(*e*) shows an example of a trigonal periodic pattern in which slits are formed into a triangular shape. In other words, the slits shown in FIGS. 5(*a*) to 5(*e*) are formed in a pattern in which the same shape is repeatedly formed when planarly viewed, i.e., in a two-dimensional periodic pattern.

Among those shown in FIGS. 5(*a*) to 5(*e*), it is more preferable to use the rectangular periodic pattern shown in FIG. 5(*a*) and the hexagonal periodic pattern shown in FIG. 5(*b*). Moreover, it is preferable that the width of the slit takes a value between a value equivalent to the thickness of a solder layer to be described later as the maximum value and the minimum value of 0.1 μm. It is more preferable that the width of the slit is within a range of 20 μm to 1 μm.

Moreover, in a perspective view of the semiconductor device 100 according to this embodiment from the upper surface side of the semiconductor element 1 toward the Cu substrate 2, a ratio of the cumulative area of the slits to the whole joint surface of the semiconductor chip, i.e., a ratio of the total orthogonal projection area of the fine slits 24 to the whole junction area of the semiconductor element 1 is preferably 0.1% to 10%, more preferably, 5% or less.

The Au-based solder layer 3 shown in FIG. 1 is a layer formed by including Cu in eutectic AuGe solder, for example. Cu included in the Au-based solder layer 3 is derived from the metal Cu plate 22 in the Cu substrate 2.

More specifically, the Au-based solder layer 3 includes Cu derived from the Cu substrate 2, as an active component.

Here, it is one of the distinctive structural characteristics of the present invention that the Au-based solder layer 3 includes Cu and that Cu is derived from the Cu substrate 2.

Furthermore, fine structures 4 with dumbbell-like cross section, which have Cu and Au as main elements, are formed so as to fill in the fine slits 24 formed in the dense metal film 23. More specifically, the fine structures 4 with dumbbell-like cross section, which have Cu and Au as main elements, are each buried in the Cu substrate 2, the Au-based solder layer 3 and the fine slits 24 in the dense metal film 23. The formation of such fine structures 4 with dumbbell-like cross section is another distinctive structural characteristic of the present invention. Here, the fine structures 4 with dumbbell-like cross section each refer to a region having the cross-section indicated by the dotted line in FIG. 1. The dumbbells of the fine structures 4 with dumbbell-like cross section are formed inside the Au-based solder layer 3 on the dense metal film 23 and inside the metal Cu plate 22 through the fine slits 24. Thus, the Au-based solder layer 3 and the Cu substrate 2 can be firmly connected, and the fine structures 4 with dumbbell-like cross section function as solder connection means for connecting the Cu substrate 2 and the Au-based solder layer 3. Moreover, as described later, Cu and Au as the main elements of the fine structures 4 with dumbbell-like cross section are derived from the Cu substrate 2 and the Au-based solder layer 3, respectively.

Figure 2:
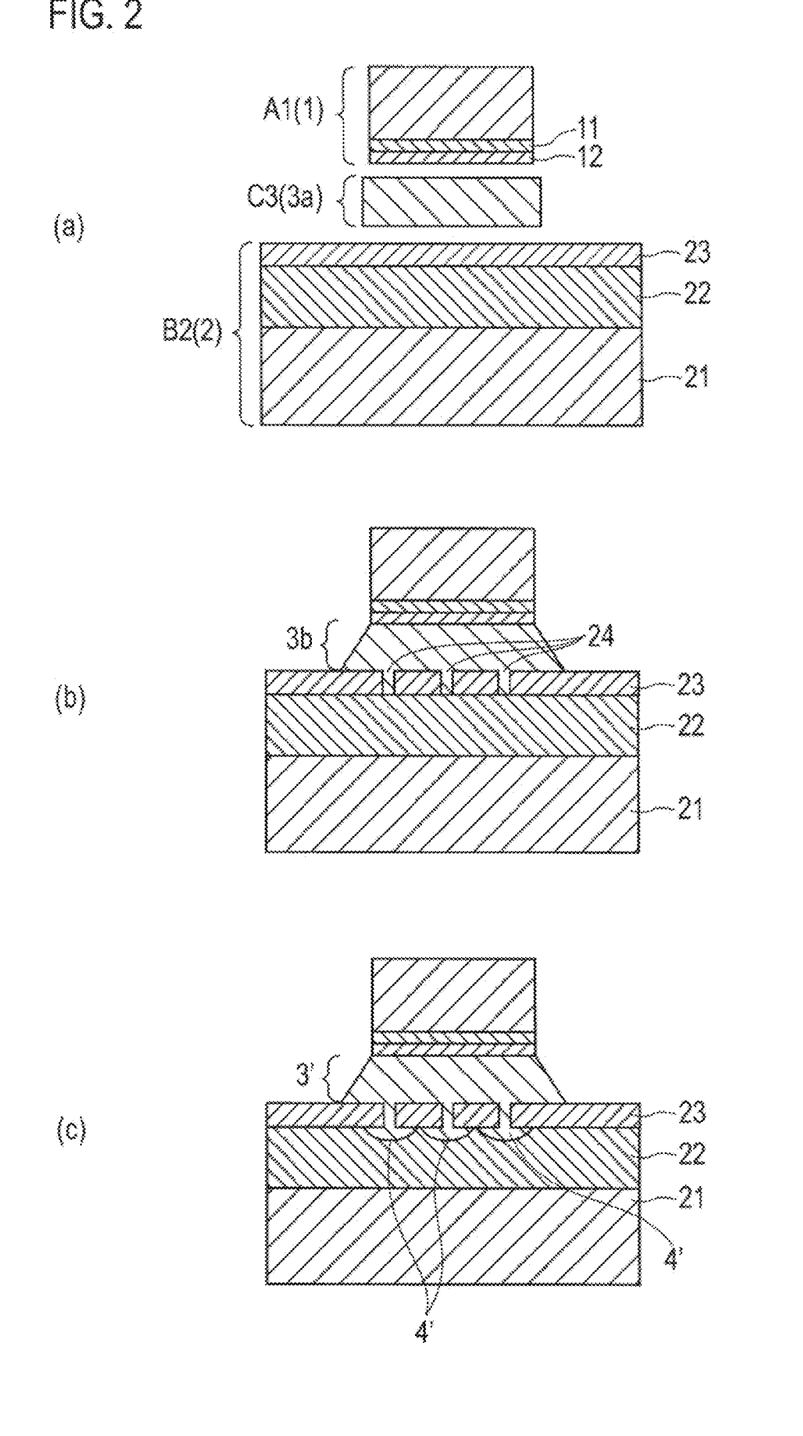
FIG. 2 is a cross-sectional view showing a method for manufacturing the semiconductor device shown in FIG. 1.

Next, steps of manufacturing the semiconductor device shown in FIG. 1 are described with reference to process drawings shown in FIGS. 2(*a*) to 2(*c*). First, as shown in FIG. 2(*a*), precursor materials A1, B2 and C3 are prepared. The precursor material A1 is the power semiconductor element 1 made of silicon carbide (SiC) shown in FIG. 1 described above. The structure of the mounting electrode 12 on the back surface of the silicon carbide (SiC) power semiconductor element 1 that is commercially available is virtually almost the same as the mounting electrode structure described above. Thus, there is no particular need for modifications to implement the present invention as long as such structures are used.

The precursor material B2 is the Cu substrate 2 shown in FIG. 1. The precursor material B2 is prepared through the following procedures. First, a commercially available Cu substrate 2 formed by attaching a metal Cu plate 22 on the surface of a ceramic substrate 21 by an active metal method or a direct joint method is prepared. Then, on the surface of the Cu substrate 2, a dense metal film (e.g., an Ni—P film having a thickness of 5 µm) 23 having fine slits 24 is formed by pattern electroless plating. The pattern plating described here is a method in which a photoresist is applied by photolithography only to portions corresponding to the fine slits 24 in the surface of the Cu substrate 2 and then plating is performed to grow Ni—P plating only in a Cu surface exposed portion without photoresist. As a result, the fine slits 24 are formed at designed positions. Then, the photoresist is removed with a solvent after the plating.

In this event, the fine slits 24 are formed to have a two-dimensional periodic pattern (predetermined pattern), as shown in FIGS. 5(a) to 5(e) described above, when planarly viewed.

As a method for forming the fine slits 24, etching, laser beam processing or other methods may be used other than the pattern plating. When etching or laser beam processing is adopted, etching or laser beam processing is performed after an Ni—P film is grown by plating on the entire surface of the metal Cu plate 22. In this event, a resist pattern is formed before the etching process.

At the bottoms of the fine slits 24, relatively easily oxidizable Cu (metal Cu plate 22) is exposed as shown in FIG. 2(b). In such a case as long-term storage, CuO is formed on the surface of the exposed metal Cu plate 22, which deteriorates wettability of the Au-based solder. To avoid such a problem, a thin Ni—P plating film (having a thickness of less than 0.2 µm) may be formed by electroless plating on the entire surface of the conductor part immediately after the dense metal film 23 is formed by pattern plating. Thus, the surface of the metal Cu plate 22, which serves as the bottoms of the fine slits 24, is covered with a thin Ni plating film (not shown in FIG. 2). In other words, it is preferable, in preventing the formation of CuO, that a process of covering the dense metal film 23 with a plating film having a thickness of less than 0.2 µm on the entire surface of the Cu substrate 2 is added to the final step of the processing of forming the dense metal film 23 having the fine slits 24 on the Cu substrate surface.

Next, although not essential, a thin Au film or Ag film may be applied by flushing plating onto the dense metal film 23. Accordingly, in a subsequent reflow process, the solder wettability is further improved, and thus the yield can be improved.

The precursor material C3 shown in FIG. 2(a) is an Au-based solder material 3a mainly made of Au, and is typically eutectic AuGe solder, eutectic AuSi solder, eutectic AuSn solder, or the like. Alternatively, a mixture of these solders may be used. Furthermore, the solder does not necessarily have to have an eutectic composition but may have a hypereutectic or hypoeutectic composition having a liquidus temperature of approximately 420° C. or less. Moreover, the precursor material C3 may include a third element as impurities to improve modification, and may be prepared as a preform (chip-shaped solid) or paste.

One of the points to be noted is that the Au-based solder material 3a used as the precursor material C3 and the Au-based solder layer 3 (see FIG. 1) in the completed semiconductor device 100 do not have the same constituent elements. Cu, which is not included in the Au-based solder material 3a as the precursor material C3, is included as an active component in the Au-based solder layer 3.

Once the preparation of the precursor materials A1, B2 and C3 is completed, organic cleaning is performed using a solvent such as acetone and isopropyl alcohol to remove contaminants adhering to the surface of each of the precursor materials A1, B2 and C3.

Subsequently, the precursor materials A1, B2 and C3 are placed in a decompression reflow device. It is assumed that the decompression reflow device has exhaust capability to reduce the pressure to about 5 millibar and has specifications to introduce inert gas (nitrogen or argon gas) having a purity of 99.99% or more.

Instead of the decompression reflow device, an atmospheric reflow device is capable of executing reflow in a reductive atmosphere or low dew point atmosphere.

Thereafter, the precursor material B2 (the Cu substrate 2) is placed on a reflow stage of the decompression reflow device, the precursor material C3 (the Au-based solder material 3a) is placed (applied when it is a paste) in a portion to be joined on the precursor material B2, and the precursor material A1 (the semiconductor element 1) is further placed thereon, as shown in FIG. 2(a). More specifically, an overlay process is performed to sequentially overlay the Cu substrate 2 coated with the dense metal film 23 having the fine slits 24, the Au-based solder material 3a having a liquidus temperature of 420° C. or less, and the semiconductor element chip (semiconductor element 1) on a heating stage (reflow stage). Note that the illustration of the reflow stage is omitted in FIG. 2.

Here, in order to prevent a positional shift of the semiconductor element 1 during a reflow process by accurately placing the precursor material C3 and the precursor material A1 in the portion to be joined on the precursor material B2, it is desirable to use a template carbon jig.

Note that, although not a requirement of the present invention, gentle pressure may be applied to the semiconductor element 1 during the reflow process, particularly, during solder melting, in order to reduce voids to be generated in the Au-based solder layer 3 shown in FIG. 1. A required load is 0.1 g/cm$^2$ or more, preferably, 0.3 g/cm$^2$ or more. For the semiconductor element 1 with an area of 4 mm$^2$, for example, a load of 0.4 g or more, preferably, 1.2 g or more may be used.

Once the above preparation is completed, the reflow process is executed. The reflow process is described in detail below. First, a sample chamber in the decompression reflow device is evacuated. When the pressure inside the sample chamber is reduced to 5 millibar or less, inert gas is introduced. This operation is performed several times to replace the air inside the sample chamber with the inert gas. Thus, the sample chamber is filled with the inert gas.

Then, the reflow stage or the entire sample chamber is heated to raise the temperature of the precursor materials A1, B2 and C3 to approximately 200° C., and the temperature is maintained for about 2 minutes. In this event, inert gas containing formic acid vapor is introduced to facilitate removal of organic contaminants.

Next, the introduction of the inert gas is stopped, and the evacuation is resumed to reduce the pressure in the sample chamber to 5 millibar or less. Moreover, the reflow stage (or the entire sample chamber) is further heated to raise the temperature of the precursor materials A1, B2 and C3 to the liquidus temperature or more of the Au-based solder material 3a, and the temperature is maintained. As the time for maintaining the temperature, 5 minutes is sufficient at the longest. When the precursor material C3 (Au-based solder material 3a) is eutectic AuGe solder, for example, typical reflow conditions include the temperature of 410° C. and 1 minute. When the temperature of the precursor material C3 exceeds the liquidus temperature, the precursor material C3 melts to wet the surface of the dense metal film 23 and the back surface of the semiconductor element 1.

In this event, as shown in FIG. 2(b), a melt (Au-based solder melt 3b) of the precursor material C3 flows into the fine slits 24 by capillary action or the like and fills in the fine slits 24 in the dense metal film 23 (Ni—P plating film). Then, the Au-based solder melt 3b very actively exchanges atoms of Au and Cu on the interface between the melt and the solid while melting the surface of the metal Cu plate 22 at the bottoms of the fine slits 24. Cu emitted from the metal Cu plate 22 melts into the layer of the Au-based solder melt 3b, easily moves and rapidly spreads across the entire layer of the Au-based solder melt 3b. As a result, the composition of a layer of an Au-based solder melt 3' is changed from Au+Ge to Au+Cu+Ge.

Meanwhile, as shown in FIG. 2(c), Au atoms emitted from the layer of the Au-based solder melt 3' containing Cu into the metal Cu plate 22 approximately isotropically spread in Cu as the solid, and modify the composition of the spread region into an Au+Cu alloy 4'. Thus, a precursor structure of the fine structures 4 with dumbbell-like cross section is formed. More specifically, the main elements Cu and Au in the fine structures 4 with dumbbell-like cross section are derived from the Cu substrate 2 and the Au-based solder layer 3, respectively. Note that, at this point, the Au-based solder layer 3 is in the liquid phase, and thus the term "precursor structure" is used.

As described above, a heating process is performed, in which the Cu substrate 2, the Au-based solder material 3a and the semiconductor element chip (semiconductor element 1), which are overlaid on the heating stage (reflow stage), are heated to raise the temperature thereof, and then the Au-based solder material 3a is melted to form a melt layer (layer of the Au-based solder melt 3b) sandwiched between the Cu substrate 2 and the semiconductor element 1.

Next, inert gas is introduced into the sample chamber, and once the pressure in the sample chamber is increased to a predetermined pressure, lowering of the temperature of the reflow stage or the entire sample chamber is immediately started. As the temperature of the Au-based solder melt 3' containing Cu drops below the solidus temperature, the layer of the Au-based solder melt 3' containing Cu is solidified. Accordingly, the Cu substrate 2 and the semiconductor element 1 are joined, and thus the semiconductor device 100 of the present invention shown in FIG. 1 is completed. More specifically, the Cu substrate 2, the semiconductor element 1 and the melt layer sandwiched between the Cu substrate 2 and the semiconductor element 1 are cooled to solidify the melt layer, thereby joining the Cu substrate 2 and the semiconductor element 1.

Thereafter, once the temperature of the reflow stage or the sample chamber is lowered to a sufficiently low temperature, the completed semiconductor device 100 is removed from the reflow device.

Figure 3:
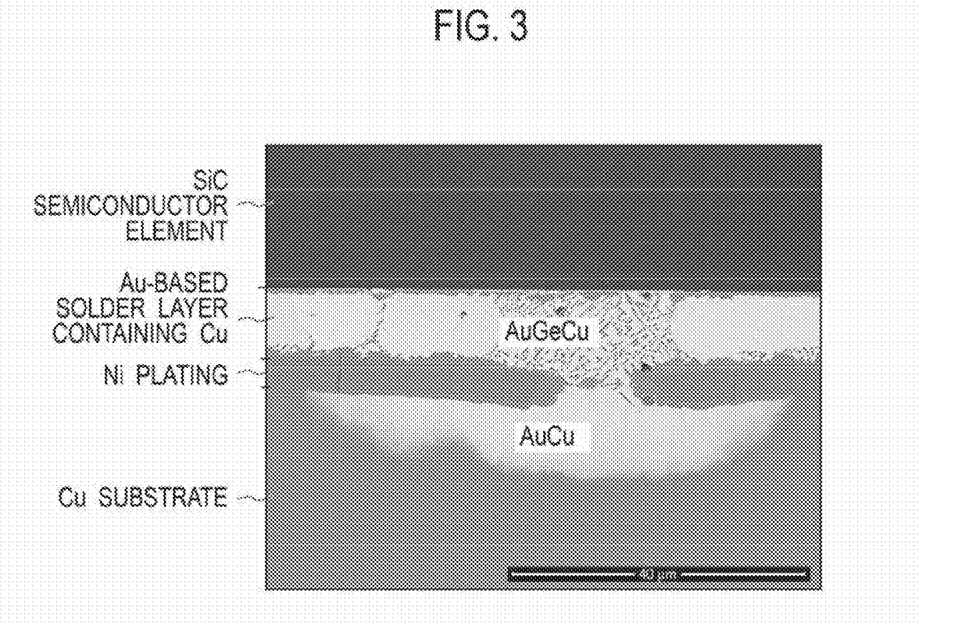
FIG. 3 is a photograph of a fine structure with dumbbell-like cross section, which is taken by a scanning electron microscope, in the cross-section of the semiconductor device manufactured by the method for manufacturing a semiconductor device according to the present invention.

FIG. 3 is a cross-sectional scanning electron microscope photograph (reflection electron image) in the vicinity of the fine slit 24 at an arbitrary position in the AuGe die attachment in the semiconductor device 100 manufactured through the procedures described above. The photograph of FIG. 3 also shows a composition identified by energy dispersive spectroscopic analysis. A region shown in white contrast on the photograph corresponds to an Au+Cu layer containing many elements Au.

It is confirmed from FIG. 3 that the fine structures 4 with dumbbell-like cross section schematically shown in FIG. 1 are formed as intended in the present invention, through the fine slits 24 having openings in the Ni plating layer (dense metal layer).

Figure 4:
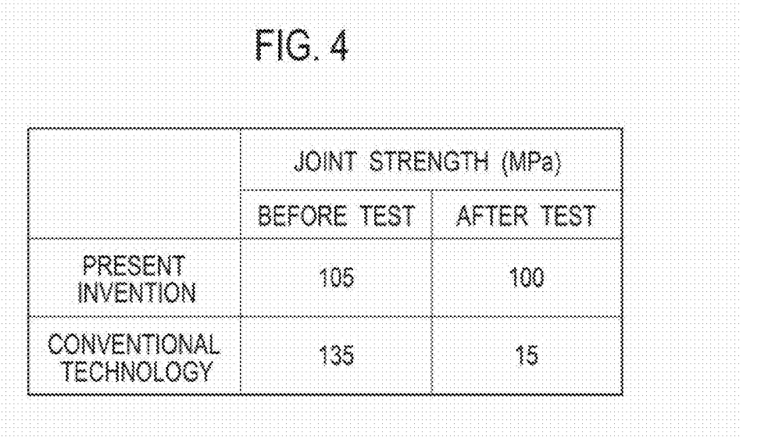
FIG. 4 is an explanatory diagram showing, in comparison with a conventional example, joint strength when the semiconductor device according to the embodiment is left for 3000 hours at 300° C.

FIG. 4 is an explanatory diagram showing initial average joint strength (share strength) of the AuGe die attachment semiconductor device manufactured by the manufacturing steps described above and average joint strength after the semiconductor device is left in the atmosphere for 3000 hours at 300° C. FIG. 4 also shows the result of Non Patent Literature 3 (conventional technology). The evaluated semiconductor chip size is 2×2 mm$^2$, which is the same as that of Non Patent Literature 3.

As is clear from FIG. 4, in Non Patent Literature 3 that is the conventional technology, the joint strength is deteriorated to 15 MPa after the elapse of 3000 hours at 300° C. On the other hand, it can be seen that, in the AuGe die attachment of the semiconductor device 100 according to this embodiment, the joint strength stays about the same as before the test, even after the elapse of 3000 hours at 300° C., and is maintained at a sufficient strength equivalent to 15 times or more that of IEC60749-19 standard.

In other words, the semiconductor device 100 according to this embodiment can solve the problem of the conventional technology that "the joint strength of the solder junction layer is lowered with time after the long-term use at high temperature, and the semiconductor chip eventually comes off around the plating layer".

Here, in the conventional Au-based die attachment semiconductor device described in Non Patent Literature 3, the joint strength is lowered with time if the device is left at high temperature, and the semiconductor chip eventually comes off. As a result of detailed experimental observation of such a phenomenon, the inventors of the present application have figured out the reason as described below, while there is a part left as a hypothesis.

In the example of the AuGe die attachment described in Non Patent Literature 3, when the die attachment is left at high temperature, the element Ge paired with Au reacts with the Ni—P plating film that is the dense metal film, thereby unevenly thinning the Ni—P plating film while generating a mechanically fragile intermetallic compound (NiGe in the example of Non Patent Literature 3). As the Ni—P plating film is thinned, P is gradually thickened. As P is thickened, the Ni—P plating film also becomes more and more mechanically fragile along with the progress of uneven thinning. It is assumed that a vertical crack is generated for some reason in the thickened Ni—P plating film in the solder layer peripheral portion that seeps around the semiconductor element chip. Alternatively, it is assumed that a vertical crack is generated in the Ni—P plating film by a crack generated in the NiGe intermetallic compound. Then, Cu below the Ni—P plating film is locally oxidized to form a large-volume Cu oxide. This local oxide formation generates a gap in Cu below the Ni—P plating film, and oxygen supply is continued through the gap. Thus, the Cu oxidation and the gap propagate under the Ni—P plating film below the semiconductor chip. Since adhesion between the Cu oxide and the Ni—P plating is poor, the joint strength is gradually deteriorated.

On the other hand, in the semiconductor device 100 of the present invention, the fine structures 4 with dumbbell-like cross section firmly fix the AuGe (Cu) solder layer to the metal Cu plate 22 by an anchor effect. Thus, formation of a gap between the Ni—P plating and the metal Cu plate 22 therebelow can be surely prevented. Accordingly, since no gap is formed, no oxygen is supplied and propagation of the gap into inside is suppressed.

Therefore, in the present invention, even if the semiconductor device is left at high temperature, very high joint strength can be maintained over a long period of time as shown in FIG. 4. Moreover, when the fine slits 24 in the Ni—P plating are provided in a two-dimensional periodic pattern within the surface of the dense metal film 23, the fine structures 4 with dumbbell-like cross section are also formed in a two-dimensional periodic pattern as a result. Thus, the anchor effect is made uniform within the surface of the dense metal film 23, and a high peel-off prevention effect can be achieved.

Here, the die attachment of the Au-based die attachment semiconductor device according to the present invention appears to be structurally more complex than the die attachment of the conventional Au-based die attachment semiconductor device. However, as described in the section of the manufacturing method, the semiconductor device can be manufactured approximately in the same manner as the conventional semiconductor device, except for the step of forming the dense metal film 23 having the fine slits 24 by pattern plating.

As described above, in the Au-based solder die attachment semiconductor device according to this embodiment, the dense metal film 23 is provided between the Cu substrate 2 and the Au-based solder layer 3, the dense metal film 23 having the fine slits 24 patterned to have a predetermined shape in a plan view. Then, the fine structures 4 with dumbbell-like cross section, which have Cu and Au as the main elements, are buried in the fine slits 24. Thus, the Au-based solder layer 3 and the Cu substrate 2 are firmly connected, making it possible to solve the conventional problem that peel-off is caused by reduction in joint strength with time. As a result, high joint strength can be maintained over a long period of time even if the semiconductor device is left at high temperature.

Moreover, the metal film mainly made of Ni, Co or both thereof is used as the dense metal film 23. Thus, the joint strength of the Au-based solder layer 3 can be further increased.

Furthermore, the metal film, which is formed by electroless plating, contains P and is mainly made of Ni, Co or both thereof, is used as the dense metal film 23. Thus, the joint strength of the Au-based solder layer 3 can be further increased.

Moreover, the fine slits 24 formed in the dense metal film 23 are formed in a two-dimensional periodic pattern in a plan view. Thus, joint can be made with uniform strength over the entire surface of the Cu substrate 2. As a result, the joint strength of the Au-based solder layer 3 can be increased.

Furthermore, the fine slits 24 formed in a two-dimensional periodic pattern have any of the rectangular periodic pattern, hexagonal periodic pattern, trigonal periodic pattern, and equally spaced parallel line pattern. Thus, the Cu substrate 2 and the semiconductor element 1 can be more evenly joined.

Moreover, the width of the fine slits 24 formed in the dense metal film 23 takes a value between the value equivalent to the thickness of the Au-based solder layer 3 as the maximum value and the minimum value of 0.1 μm. Thus, the joint by the fine structures 4 with dumbbell-like cross section can be improved.

Furthermore, the ratio of the total orthogonal projection area of the slits to the whole junction area is within the range of 0.1% to 10%. Thus, the joint can be made evenly over the entire surface of the Cu substrate 2 with a suitable area. As a result, the Cu substrate 2 and the semiconductor element 1 can be more firmly joined.

Moreover, since the Au-based solder layer 3 includes Cu derived from the Cu substrate 2, as an active component, stronger joint can be achieved.

Furthermore, Cu and Au as the main elements of the fine structures 4 with dumbbell-like cross section are derived from the Cu substrate 2 and the Au-based solder layer 3, respectively. Accordingly, the fine structures 4 with dumbbell-like cross section can be made stronger, and thus stronger joint can be achieved.

The method for manufacturing a semiconductor device according to the present invention includes an overlay step of sequentially overlaying the Cu substrate coated with the dense metal film having the fine slits, the Au-based solder material having a liquidus temperature of 420° C. or less, and the semiconductor element chip on the heating stage. The semiconductor device described above is manufactured by a heating step of melting the Au-based solder material to form a melt layer and a cooling step of cooling and solidifying the melt layer. Therefore, the semiconductor device having stronger joint can be manufactured by approximately the same steps as those of the conventional technology.

Furthermore, pattern electroless plating, etching or laser beam processing is used to form the dense metal film 23 having the fine slits 24 on the surface of the Cu substrate 2. Thus, the dense metal film 23 having the fine slits 24 can be formed by simple processing.

Moreover, a process of covering the dense metal film 23 with a plating film having a thickness of less than 0.2 μm on the entire surface of the Cu substrate 2 is added to the final step of the processing of forming the dense metal film 23 having the fine slits 24 on the Cu substrate surface. Thus, formation of CuO on the surface of the Cu substrate 2 can be prevented. As a result, deterioration in wettability of the Au-based solder material 3a can be prevented.

Furthermore, the heating step is executed under reduced pressure where the pressure in the sample chamber is 5 millibar or less. Thus, the Au-based solder layer can be smoothly turned into solder melt.

The Au-based solder die attachment semiconductor device and the manufacturing method thereof according to the present invention are described above based on the illustrated embodiment. However, the present invention is not limited thereto, but the configurations of the respective parts can be replaced with arbitrary configurations having the same functions.

This application is based upon and claims the benefit of priority from the prior Japanese Patent Application No. 2012-250852, filed on Nov. 15, 2012; the entire contents of which are incorporated herein by reference.

INDUSTRIAL APPLICABILITY

According to an Au-based solder die attachment semiconductor device and a manufacturing method thereof according to one aspect of the present invention, a dense metal film having fine slits is provided between a Cu substrate and an Au-based solder layer, and fine structures with dumbbell-like cross section are buried in the fine slits.

Thus, the Au-based solder layer and the Cu substrate can be firmly joined, and high joint strength can be maintained over a long period of time even if the semiconductor device is left at high temperature. Therefore, the Au-based solder die attachment semiconductor device and the manufacturing method thereof according to the one aspect of the present invention are industrially applicable.

REFERENCE SIGNS LIST 1 semiconductor element
2 Cu substrate
3 Au-based solder layer
4 fine structure with dumbbell-like cross section
11 ohmic contact
12 mounting electrode
21 ceramic substrate
22 metal Cu plate
23 dense metal film
24 fine slit
100 semiconductor device

The invention claimed is:

1. A gold (Au)-based solder die attachment semiconductor device with a die attachment structure having an Au-based solder layer sandwiched between a semiconductor element chip and a copper (Cu) substrate mainly made of Cu, comprising:
  a metal film arranged between the Cu substrate and the Au-based solder layer, the metal film having slits patterned to have a predetermined shape in a plan view; and
  fine structures with dumbbell shaped cross section each buried in the Cu substrate, the Au-based solder layer, and the slits in the metal film, the fine structures having Cu and Au as main elements.

2. The Au-based solder die attachment semiconductor device according to claim 1, wherein the metal film is a metal film mainly made of nickel (Ni), cobalt (Co) or both thereof.

3. The Au-based solder die attachment semiconductor device according to claim 1, wherein the metal film is a metal film containing phosphorus (P) and is mainly made of nickel (Ni), cobalt (Co) or both thereof.

4. The Au-based solder die attachment semiconductor device according to claim 1, wherein the slits formed in the metal film are formed in a two-dimensional periodic pattern in a plan view.

5. The Au-based solder die attachment semiconductor device according to claim 4, wherein the slits formed in the two-dimensional periodic pattern have any of a rectangular periodic pattern, a hexagonal periodic pattern, a trigonal periodic pattern, or an equally spaced parallel line pattern.

6. The Au-based solder die attachment semiconductor device according to claim 1, wherein a width of the slits formed in the metal film takes a value between the value equivalent to a thickness of the Au-based solder layer as the maximum value and the minimum value of 0.1 µm.

7. The Au-based solder die attachment semiconductor device according to claim 1, wherein a ratio of the total orthogonal projection area of the slits to a whole junction area of the semiconductor element chip is within the range of 0.1% to 10%.

8. The Au-based solder die attachment semiconductor device according to claim 1, wherein the Au-based solder layer includes Cu derived from the Cu substrate, as an active component.

9. The Au-based solder die attachment semiconductor device according to claim 1, wherein Cu and Au as the main elements of the fine structures with dumbbell shaped cross section are derived from the Cu substrate and the Au-based solder layer, respectively.

10. A gold (Au)-based solder die attachment semiconductor device with a die attachment structure having an Au-based solder layer sandwiched between a semiconductor element chip and a copper (Cu) substrate mainly made of Cu, comprising:
  a metal film arranged between the Cu substrate and the Au-based solder layer, the metal film having slits patterned to have a predetermined shape in a plan view; and
  solder joint means for joining the Cu substrate and the Au-based solder layer by fine structures with dumbbell shaped cross section each buried in the Cu substrate, the Au-based solder layer, and the slits in the metal film, the fine structures having Cu and Au as main elements.

* * * * *